United States Patent
Tsuchida et al.

(10) Patent No.: US 10,585,122 B2
(45) Date of Patent: Mar. 10, 2020

(54) CURRENT DETECTION CIRCUIT NOT AFFECTED BY NOISE

(71) Applicant: FANUC CORPORATION, Yamanashi (JP)

(72) Inventors: Kunio Tsuchida, Yamanashi (JP); Taku Sasaki, Yamanashi (JP); Kiichi Inaba, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 242 days.

(21) Appl. No.: 15/692,325

(22) Filed: Aug. 31, 2017

(65) Prior Publication Data

US 2018/0067148 A1 Mar. 8, 2018

(30) Foreign Application Priority Data

Sep. 6, 2016 (JP) ................... 2016-173798

(51) Int. Cl.
*G01R 19/00* (2006.01)
*G01R 19/165* (2006.01)
*G01R 19/18* (2006.01)

(52) U.S. Cl.
CPC ..... *G01R 19/0053* (2013.01); *G01R 19/0092* (2013.01); *G01R 19/16538* (2013.01); *G01R 19/18* (2013.01)

(58) Field of Classification Search
CPC .............................. G01R 19/0053; G01R 19/0092; G01R 19/18; G01R 19/16538; H02P 6/28; H02P 21/22; H02M 2001/009; H02M 1/44
See application file for complete search history.

(56) References Cited

U.S. PATENT DOCUMENTS

| 6,858,433 | B1 | 2/2005 | Zivitz |
| 7,084,601 | B2 | 8/2006 | Maeda et al. |
| 7,898,240 | B2 | 3/2011 | Shibahara et al. |
| 9,054,614 | B2 | 6/2015 | Roh |

(Continued)

FOREIGN PATENT DOCUMENTS

| CN | 103199781 A | 7/2013 |
| JP | S51090240 A | 8/1976 |

(Continued)

*Primary Examiner* — Son T Le
*Assistant Examiner* — Dustin R Dickinson
(74) *Attorney, Agent, or Firm* — RatnerPrestia

(57) ABSTRACT

A current detection circuit includes: a resistor in a current path; first and second signal transmission units that transmit signals of first and second terminal sides of the resistor; a first difference operation unit that executes a difference operation on the signals transmitted by the first and second signal transmission units; a noise-capturing transmission unit starting point; third and fourth signal transmission units connected with the noise-capturing transmission unit starting point; a second difference operation unit that executes a difference operation on the signals transmitted by the third and fourth signal transmission units; and a summing operation unit that executes a summing operation on the first and second difference signals, wherein the first signal transmission unit and the fourth signal transmission unit are disposed close to each other and the second signal transmission unit and the third signal transmission unit are disposed close to each other.

5 Claims, 6 Drawing Sheets

(56) References Cited

U.S. PATENT DOCUMENTS

| | | | | |
|---|---|---|---|---|
| 2004/0183498 A1* | 9/2004 | Iwaji | ................. | H02P 21/00 |
| | | | | 318/801 |
| 2011/0062934 A1* | 3/2011 | Wolf | ................. | H02M 7/48 |
| | | | | 323/304 |
| 2014/0300304 A1* | 10/2014 | Omae | ................. | H02K 11/024 |
| | | | | 318/400.24 |

FOREIGN PATENT DOCUMENTS

| | | |
|---|---|---|
| JP | S61112969 A | 5/1986 |
| JP | 2001349868 A | 12/2001 |
| JP | 5072561 B2 | 11/2012 |
| JP | 2014-014252 A | 1/2014 |
| WO | 03032478 A1 | 4/2003 |
| WO | 2006090769 A1 | 8/2006 |

* cited by examiner

CURRENT DETECTION CIRCUIT NOT AFFECTED BY NOISE

BACKGROUND OF THE INVENTION

1. Field of the Invention

The present invention relates to a current detection circuit that detects a current flowing in a current path in a motor driving device.

2. Description of the Related Art

In a motor driving device that derives a motor in a machine tool, an industrial machine, a forging press machine, an injection molding machine, or various kinds of robots, the AC power inputted to the AC power supply side is converted to DC power by a converter, this DC power is then converted to AC power by an inverter, and this AC power is used as the power for driving the motor.

FIG. 7 illustrates a circuit diagram of a common motor driving device. In a motor driving device 100 that drives a three-phase current motor 200, for example, a DC voltage supplied by a DC power supply is applied to the DC input side of an inverter 51, and a three-phase AC current is outputted by the inverter 51 to drive the motor 200. A smoothing capacitor 53 is provided on the DC input side of the inverter 51. Though not illustrated, on the DC input side of the inverter 51 is provided a converter (rectifier) for converting an AC current inputted by a commercial AC power supply to a DC current and outputting the DC current.

The inverter 51 is configured as a full-bridge inverter in which switching devices $S_{u1}$, $S_{v1}$, $S_{w1}$, $S_{u2}$, $S_{v2}$, and $S_{w2}$ coupled with freewheeling diodes in antiparallel connection are provided on the upper arms and the lower arms. More specifically, a series circuit is formed by switching devices $S_{u1}$ and $S_{u2}$ for u-phase, a series circuit is formed by switching devices $S_{v1}$ and $S_{v2}$ for v-phase, and a series circuit is formed by switching devices $S_{w1}$ and $S_{w2}$ for w-phase. To the gates of the switching devices $S_{u1}$, $S_{v1}$, $S_{w1}$, $S_{u2}$, $S_{v2}$, and $S_{w2}$, gate drive commands $G_{u1}$, $G_{v1}$, $G_{w1}$, $G_{u2}$, $G_{v2}$, and $G_{w2}$ sent by the current control unit 52 are applied, and the switching device $S_{u1}$, $S_{v1}$, $S_{w1}$, $S_{u2}$, $S_{v2}$, and $S_{w2}$ are on-off controlled in accordance with the gate drive commands $G_{u1}$, $G_{v1}$, $G^{w1}$, $G_{u2}$, $G_{v2}$, and $G_{w2}$. The inverter 51 thereby converts the DC power inputted from its DC input side to an AC current with a desired frequency and a desired voltage for driving the three-phase current motor.

The current control unit 52 generates the gate drive commands $G_{u1}$, $G_{v1}$, $G_{w1}$, $G_{u2}$, $G_{v2}$, and $G_{w2}$ based on current commands inputted thereto and feedback values of the AC current flowing from the inverter 51 to the motor 200. The AC current flowing from the inverter 51 to the motor 200 is detected by current detection circuits 1001. To generate appropriate gate drive commands $G_{u1}$, $G_{v1}$, $G_{w1}$, $G_{u2}$, $G_{v2}$ and $G_{w2}$ and to control the motor 200 with high accuracy, it is important to perform the current feedback control using current values detected by the current detection circuits 1001 with high accuracy.

As for techniques of detecting a current to be used in current detection circuits, Japanese Unexamined Patent Publication (Kokai) No. 2014-14252, for example, describes a shunt resistor method of inserting a resistor (shunt resistor) to the current path in which a current is to be detected, detecting the potential difference produced between the terminals of the resistor when a current flows through the resister, and calculate a current value based on the detected voltage. The shunt resistor serves to convert the value of the current flowing in the shunt resistor to a potential difference produced between the terminals at both ends of the shunt resistor. The terminals at both ends of the shunt resistor are connected with the differential input terminals of an arithmetic circuit through, for example, transmission paths such as a pattern on a printed board. When the transmission path in the current detection circuit is affected by external noise, however, operation results of the arithmetic circuit are affected and the accuracy of current detection deteriorates. External noise that deteriorates the accuracy of current detection by the current detection circuit includes noise caused by electromagnetic induction due to a change in the magnetic flux through the region enclosed by a closed loop formed by transmission paths in the current detection circuit.

FIG. 8 is a circuit diagram for illustrating a deterioration of the accuracy of current detection by a conventional current detection circuit employing a shunt resistor method due to an effect of external noise. Electromagnetic induction is a phenomenon that a change in magnetic flux produces an electromotive force in a conductor in the environment of the magnetic flux. A conventional current detection circuit 1001, employing a shunt resistor method and provided in a motor driving device, includes a shunt resistor 61 provided in the current path in which a current is to be detected, a difference operation unit 63 to calculate the potential difference between the both terminals of the shunt resistor 61, a transmission path 62-1 connecting the current input side of the shunt resistor 61 with the positive input terminal of the difference operation unit 63, and a transmission path 62-2 connecting the current output side of the shunt resistor 61 with the negative input terminal of the difference operation unit 63. The current detection circuit 1001 employing a shunt resistor method has a closed loop formed by conductors including the shunt resistor 61, the transmission path 62-2, the difference operation unit 63, and the transmission path 62-1. When the external noise generated by an external noise source 300 changes the magnetic flux through the region enclosed by the closed loop, an electromotive force is produced in the transmission paths 62-1 and 62-2 due to electromagnetic induction and, as a result, the output signal of the difference operation unit 63 is affected. Let, for example, the side of the shunt resistor 61 from which current flows out be at a reference potential (0 volt), let $V_i$ be the voltage produced across the shunt resistor 61 due to the current through the current path, and let $V_n$ be the electromotive force produced by the change in the magnetic flux through the region enclosed by the closed loop formed by the conductors due to the external noise generated by the external noise source 300. The voltage $V_i$ is inputted to the positive input terminal (+) of the difference operation unit 63 and the voltage $-V_n$ is inputted to the negative input terminal (−) of the difference operation unit 63; therefore, the result of the operation by the difference operation unit 63 turns out to be $V_i + V_n$, which is the sum of $V_i$, which would be the appropriate output, and $V_n$, which is a voltage produced by the external noise. In other words, the result of the current detection by the current detection circuit 1001 contains an error.

The electromotive force produced in the transmission paths 62-1 and 62-2 due to electromagnetic induction is in proportion to the amount of change per unit time in the magnetic flux through the region enclosed by the closed loop formed by the transmission paths 62-1 and 62-2. When the external noise source 300 is a conductor separate from the current path in which a current is to be detected by the current detection circuit 1001, the amount of change in the magnetic flux through the region enclosed by the closed loop in the current detection circuit 1001 is in proportion to the change in the current flowing in the conductor forming the external noise source 300 and in inverse proportion to the distance between the current detection circuit 1001 and the conductor forming the external noise source 300. In other words, with an increasing amount of change in the current flowing in the conductor forming the external noise source 300 (i.e. a conductor separate from the current path in which a current is to be detected by the current detection circuit 1001) or with a decreasing distance between the current detection circuit 1001 and the conductor forming the external noise source 300, the magnetic flux through the region enclosed by the closed loop in the current detection circuit 1001 changes more greatly and a greater electromotive force $V_n$ is produced by the change in the magnetic flux, which results in a deterioration of the accuracy in the current detection by the current detection circuit 1001.

In motor driving devices, in particular, there are many current paths in which occur large current changes likely to cause electromagnetic induction, and a current detection circuit employing a shunt resistor method is often disposed in the vicinity of such current paths with large current changes. It is therefore important to design a current detection circuit not affected by the noise due to electromagnetic induction generated in the current paths when detecting a current flowing in the motor.

According to a technique of reducing the effects of external noise in a current detection circuit employing a shunt resistor method, transmission paths are disposed close to each other. FIG. 9 is a circuit diagram for illustrating a common technique of reducing the effects of external noise in a conventional current detection circuit employing a shunt resistor method. By disposing the transmission path 62-1 and the transmission path 62-2 close to each other, the closed loop formed by the shunt resistor 61, the transmission path 62-2, the difference operation unit 63, and the transmission path 62-1 is narrowed, the magnetic flux through the region enclosed by the closed loop is thereby reduced, the change in the magnetic flux becomes smaller, the electromotive force produced in the transmission paths 62-1 and 62-2 due to electromagnetic induction is reduced, and as a result the effects on the output signals of the difference operation unit 63 are reduced.

As described above, to reduce the effects by the external noise in a current detection circuit employing a shunt resistor method, it is desirable to dispose the transmission path connecting the current input side of the shunt resistor with the positive input terminal of the difference operation unit and the transmission path connecting the current output side of the shunt resistor with the negative input terminal of the difference operation unit close to each other.

In practice, however, it is difficult to arrange these transmission paths close to each other and, in particular, the transmission paths near the shunt resistor and the transmission paths near the difference operation unit are not allowed to be disposed close to each other due to the constraints by the physical structures of the hunt resistor and the difference operation unit. When these transmission paths are not disposed consistently close to each other, the current detection circuit is more susceptible to the effects of the fluctuation of the magnetic flux through the region enclosed by the closed loop including these transmission paths. As a result, an electromotive force is produced in the transmission paths due to electromagnetic induction caused by the external noise, which greatly deteriorates the accuracy of the current detection by the current detection circuit. When a current value detected by the current detection circuit includes effects of the external noise, the motor driving device using the detected current value for feedback control is hindered from generating appropriate gate drive commands, which precludes realization of high-accuracy motor control.

SUMMARY OF INVENTION

There is desired a current detection circuit that employs a shunt resistor method and detects current flowing in a current path in a motor driving device without being affected by external noise.

According to an aspect of the present disclosure, a current detection circuit that detects a current flowing in a current path in a motor driving device includes: a resistor disposed in the current path; a first signal transmission unit that transmits a signal indicating a potential at a first terminal side of the resistor; a second signal transmission unit that transmits a signal indicating a potential at a second terminal side of the resistor; a first difference operation unit that obtains a first difference signal by executing a difference operation on the signal transmitted by the first signal transmission unit and the signal transmitted by the second signal transmission unit; a noise-capturing transmission unit starting point provided in the motor driving device; a third signal transmission unit connected with the noise-capturing transmission unit starting point; a fourth signal transmission unit connected with the noise-capturing transmission unit starting point and being a different unit from the third signal transmission unit; a second difference operation unit that obtains a second difference signal by executing a difference operation on the signal transmitted by the third signal transmission unit and the signal transmitted by the fourth signal transmission unit; and a summing operation unit that obtains a summed signal by executing a summing operation on the first difference signal and the second difference signal, wherein the first signal transmission unit and the fourth signal transmission unit are disposed close to each other and the second signal transmission unit and the third signal transmission unit are disposed close to each other.

Herein, the noise-capturing transmission unit starting point may be disposed in such a position that magnetic flux through a region enclosed by a closed loop formed by the resistor, the first signal transmission unit, the first difference operation unit, and the second signal transmission unit may be substantially identical to magnetic flux through a region enclosed by a closed loop formed by the noise-capturing transmission unit starting point, the third signal transmission unit, the second difference operation unit, and the fourth signal transmission unit.

Further, the noise-capturing transmission unit starting point may be disposed either on a current path on the second terminal side of the resistor or on a branch line of a current path on the second terminal side of the resistor.

Further, on opposite surfaces of a printed circuit board, the first signal transmission unit and the fourth signal transmission unit may be disposed in plane symmetry, the second signal transmission unit and the third signal transmission unit may be disposed in plane symmetry, the first difference operation unit and the second difference operation unit may be disposed in plane symmetry, with respect to the printed circuit board.

Further, the first difference signal and the second difference signal may be digital data, and wherein the summing operation unit executes a summing operation by digital arithmetic processing.

Further, the current detection circuit may further include an alarm unit that outputs an alarm signal when the second difference signal exceeds a certain threshold value.

BRIEF DESCRIPTION OF THE DRAWINGS

The present invention will be understood more clearly by referring to the following accompanying drawings.

DETAILED DESCRIPTION

Figure 1:
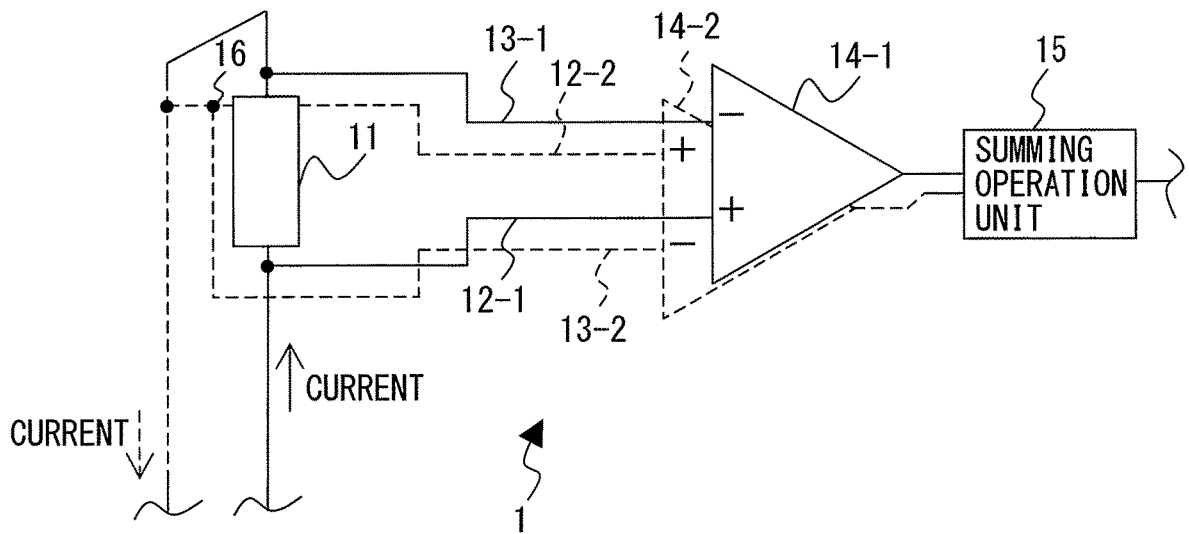
FIG. 1 is a diagram schematically illustrating a current detection circuit according to an embodiment of the present disclosure.

Next, an aspect of the present disclosure will be described with reference to the attached drawings. In the drawings referred to below, like members are denoted by like reference numerals. The drawings are presented in various scales to aid the readers' understanding. The drawings merely represent an example embodiment of an aspect of the present disclosure and an aspect of the present disclosure may take a form other than the illustrated embodiment.

Figure 2:
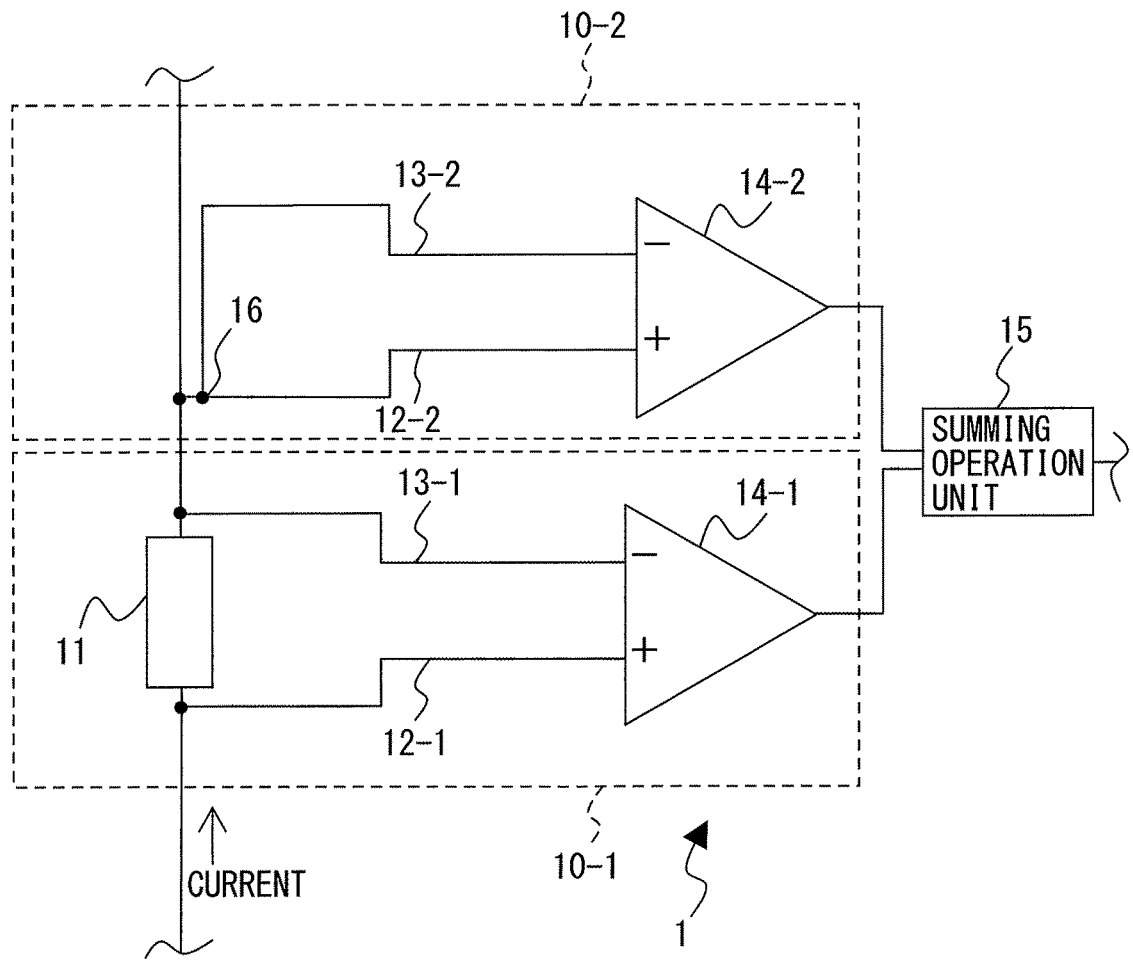
FIG. 2 is a circuit diagram of the current detection circuit illustrated in FIG. 1.

FIG. 1 is a diagram schematically illustrating a current detection circuit according to an embodiment of the present disclosure. FIG. 2 is a circuit diagram of the current detection circuit illustrated in FIG. 1.

As will be described in detail below, the current detection circuit 1 according to the present embodiment has components disposed on the opposite surfaces of a printed circuit board in plane symmetry with respect to the printed circuit board. In FIG. 1, the printed circuit board is not illustrated in the drawing for simplicity's sake, and the components disposed on the front surface of the printed circuit board are denoted by solid lines while the components disposed on the back surface of the printed circuit board are denoted by broken lines. Note that the expressions "the front surface" and "the back surface" of the printed circuit board are used solely for convenience. The surface on which the components denoted by solid lines in FIG. 1 may be referred to as "the back surface" and the surface on which the components denoted by broken lines may be referred to as "the front surface". FIG. 2 is a more simplified diagram to depict the current detection circuit 1 illustrated in FIG. 1 on a planar circuit diagram. Note that the direction of the current flow-ing through the register 11 is merely an example. Even when the current flows in the opposite direction, the current detection circuit 1 can detect the current by the same principle.

The current detection circuit 1 according to the present embodiment includes a resistor 11, a first signal transmission unit 12-1, a second signal transmission unit 13-1, a first difference operation unit 14-1, a noise-capturing transmission unit starting point 16, a third signal transmission unit 12-2, a fourth signal transmission unit 13-2, a second difference operation unit 14-2, and a summing operation unit 15.

The resistor 11 is a shunt resistor disposed in a current path in a motor driving device. Of the terminals at both ends of the resistor 11 in the current path, the terminal into which current flows will be hereinafter referred to as "the first terminal" and the terminal from which current flows out will be hereinafter referred to as "the second terminal".

The first signal transmission unit 12-1 is a signal wire connecting the first terminal side of the resistor 11 with the positive input terminal (+) of the first difference operation unit 14-1, which will be described later, and transmits a signal indicating a potential at the first terminal side of the resistor 11.

The second signal transmission unit 13-1 is a signal wire connecting the second terminal side of the resistor 11 with the negative input terminal (−) of the first difference operation unit 14-1, which will be described later, and transmits a signal indicating a potential at the second terminal side of the resistor 11.

The noise-capturing transmission unit starting point 16 is set as a "starting point" of the wiring arrangements of the third signal transmission unit 12-2 and the fourth signal transmission unit 13-2, which will be described later, and is provided in the motor driving device. As the third signal transmission unit 12-2 and the fourth signal transmission unit 13-2 are formed by conductors of the same kind, the third signal transmission unit 12-2 and the fourth signal transmission unit 13-2 practically form a unitary signal wire when both disposed so as to extend from the noise-capturing transmission unit starting point 16. In other words, the "noise-capturing transmission unit starting point" may be understood as a term for defining the arrangement positions of the third signal transmission unit 12-2 and the fourth signal transmission unit 13-2. Specific examples of the position of the noise-capturing transmission unit starting point 16 will be described later.

The third signal transmission unit 12-2 is a signal wire extending from the noise-capturing transmission unit starting point 16 and is connected with the positive input terminal (+) of the second difference operation unit 14-2, which will be described later.

The fourth signal transmission unit 13-2 is also a signal wire extending from the noise-capturing transmission unit starting point 16 but is provided as a different unit from the third signal transmission unit 12-2 and connected with the negative input terminal (−) of the second difference operation unit 14-2, which will be described later.

Specific examples of arrangement positions of the noise-capturing transmission unit starting point 16 will be described below.

The above-described noise-capturing transmission unit starting point 16 is disposed in such a position that the magnetic flux through the region enclosed by the closed loop in a first differential signal transmission circuit 10-1 formed by the resistor 11, the first signal transmission unit 12-1, the first difference operation unit 14-1, and the second signal transmission unit 13-1 is substantially identical to the magnetic flux through the region enclosed by the closed loop in a second differential signal transmission circuit 10-2 formed by the noise-capturing transmission unit starting point 16, the third signal transmission unit 12-2, the second difference operation unit 14-2, and the fourth signal transmission unit 13-2. To achieve the above-described identity of the magnetic flux, for example, the first signal transmission unit 12-1 and the fourth signal transmission unit 13-2 are disposed close to each other, the second signal transmission unit 13-1 and the third signal transmission unit 12-2 are disposed close to each other, and the components forming the first differential signal transmission circuit 10-1 and the second differential signal transmission circuit 10-2 are disposed in such positions that the area enclosed by the closed loop in the first differential signal transmission circuit 10-1 and the area enclosed by the closed loop in the second differential signal transmission circuit 10-2 are substantially equal.

In particular, in an embodiment illustrated in FIGS. 1 and 2, in order to dispose the first signal transmission unit 12-1 and the fourth signal transmission unit 13-2 close to each other and to dispose the second signal transmission unit 13-1 and the third signal transmission unit 12-2 close to each other, the first signal transmission unit 12-1 and the fourth signal transmission unit 13-2 are disposed on the opposite surfaces of a printed circuit board in plane symmetry with respect to the printed circuit board, and the second signal transmission unit 13-1 and the third signal transmission unit 12-2 are disposed on the opposite surfaces of the printed circuit board in plane symmetry with respect to the printed circuit board.

It is advantageous in simplifying the circuit designing of the signal transmission units to dispose the noise-capturing transmission unit starting point 16 on the surface of the printed circuit board opposite to the surface on which the resistor 11 is disposed in such a way that the noise-capturing transmission unit starting point 16 and the resistor 11 are in plane symmetry with respect to the printed circuit board. Further, in the embodiment illustrated in FIGS. 1 and 2, the noise-capturing transmission unit starting point 16 is disposed on a branch line of the current path on the second terminal side of the resistor 11, as illustrated in FIG. 1. Such disposal of the noise-capturing transmission unit starting point 16 on a branch line of the current path on the second terminal side of the resistor 11 is advantageous in simplifying the circuit designing by providing a common ground voltage for the first difference operation unit 14-1 and the second difference operation unit 14-2. The noise-capturing transmission unit starting point 16 may be disposed directly on the current path on the second terminal side of the resistor 11.

The first difference operation unit 14-1 is an arithmetic circuit that obtains a first difference signal by executing a difference operation on a signal transmitted by the first signal transmission unit 12-1 and a signal transmitted by the second signal transmission unit 13-1. The first signal transmission unit 12-1 is connected with the positive input terminal (+) of the first difference operation unit 14-1 and the second signal transmission unit 13-1 is connected with the negative input terminal (−) of the first difference operation unit 14-1.

The second difference operation unit 14-2 is an arithmetic circuit that obtains a second difference signal by executing a difference operation on a signal transmitted by the third signal transmission unit 12-2 and a signal transmitted by the fourth signal transmission unit 13-2. Note that the third signal transmission unit 12-2 is connected with the positive input terminal (+) of the second difference operation unit 14-2 and the fourth signal transmission unit 13-2 is connected with the negative input terminal (−) of the second difference operation unit 14-2 so that the differential signal transmitted by the second differential signal transmission circuit 10-2 including the third signal transmission unit 12-2 and the fourth signal transmission unit 13-2 and inputted to the second difference operation unit 14-2 have a polarity reverse to that of the differential signal transmitted by the first differential signal transmission circuit 10-1 including the first signal transmission unit 12-1 and the second signal transmission unit 13-1 and inputted to the first difference operation unit 14-1.

The above-described first difference operation unit 14-1 and the second difference operation unit 14-2 are disposed on the opposite surfaces of the printed circuit board in plane symmetry with respect to the printed circuit board. This also ensures that the first difference operation unit 14-1 and the second difference operation unit 14-2 are disposed close to each other.

The summing operation unit 15 is an arithmetic circuit that obtains a summed signal by executing a summing operation on the first difference signal outputted by the first difference operation unit 14-1 and the second difference signal outputted by the second difference operation unit 14-2. The summing operation unit 15 may be disposed either on the front surface or on the back surface of the printed circuit board. The signal outputted by the summing operation unit 15 corresponds to the result of the current detection by the current detection circuit 1. The current detection circuit 1 sends this summed signal to a subsequent circuit not illustrated (for example, a current control unit in the motor driving device) as a signal indicating the current flowing through the current path. The first difference signal and the second difference signal on which the summing operation unit 15 executes a summing operation are preferably digital data in order to enhance resistance to the noise from the external noise source. In such a case, an analogue-digital (AD) conversion circuit (not illustrated) is provided between the output terminal of the first difference operation unit 14-1 and the summing operation unit 15 and also between the second difference operation unit 14-2 and the summing operation unit 15. The summing operation unit 15 executes the summing operation by digital arithmetic processing.

As described above, according to the present embodiment, on the front surface of the printed circuit board is formed the first differential signal transmission circuit 10-1 (denoted by solid lines in FIG. 1 and in FIG. 3 to be described later) including the resistor 11, the first signal transmission unit 12-1, the first difference operation unit 14-1, and the second signal transmission unit 13-1, wherein the first signal transmission unit 12-1 is connected with the positive input terminal (+) of the first difference operation unit 14-1, and the second signal transmission unit 13-1 is connected with the negative input terminal (−) of the first difference operation unit 14-1. On the back surface of the printed circuit board is formed the second differential signal transmission circuit 10-2 (denoted by broken lines in FIG. 1 and in FIG. 3 to be described later) including the noise-capturing transmission unit starting point 16, the third signal transmission unit 12-2, the second difference operation unit 14-2, and the fourth signal transmission unit 13-2, wherein the third signal transmission unit 12-2 is connected with the positive input terminal (+) of the second difference operation unit 14-2, and the fourth signal transmission unit 13-2 is connected with the negative input terminal (−) of the second difference operation unit 14-2. Further, on the opposite surfaces of the printed circuit board, the first signal transmission unit 12-1 and the fourth signal transmission unit 13-2 are disposed in plane symmetry, the second signal transmission unit 13-1 and the third signal transmission unit 12-2 are disposed in plane symmetry, and the first difference operation unit 14-1 and the second difference operation unit 14-2 are disposed in plane symmetry, with respect to the printed circuit board.

When the components are disposed in a manner as described above, the magnetic flux through the region enclosed by the closed loop in the first differential signal transmission circuit 10-1 formed by the resistor 11, the first signal transmission unit 12-1, the first difference operation unit 14-1, and the second signal transmission unit 13-1 is substantially identical to the magnetic flux through the region enclosed by the closed loop in the second differential signal transmission circuit 10-2 formed by the noise-capturing transmission unit starting point 16, the third signal transmission unit 12-2, the second difference operation unit 14-2, and the fourth signal transmission unit 13-2. Besides, the first differential signal transmission circuit 10-1 and the second differential signal transmission circuit 10-2 are disposed on the opposite surfaces of the printed circuit board in plane symmetry with respect to the printed circuit board to give reverse polarities to the signals transmitted by the first differential signal transmission circuit 10-1 and the second differential signal transmission circuit 10-2.

As commonly used printed circuit boards are a few millimeters thick, the first differential signal transmission circuit 10-1 and the second differential signal transmission circuit 10-2 are sufficiently close to each other when they are disposed on the opposite surfaces of the printed circuit board.

Figure 3:
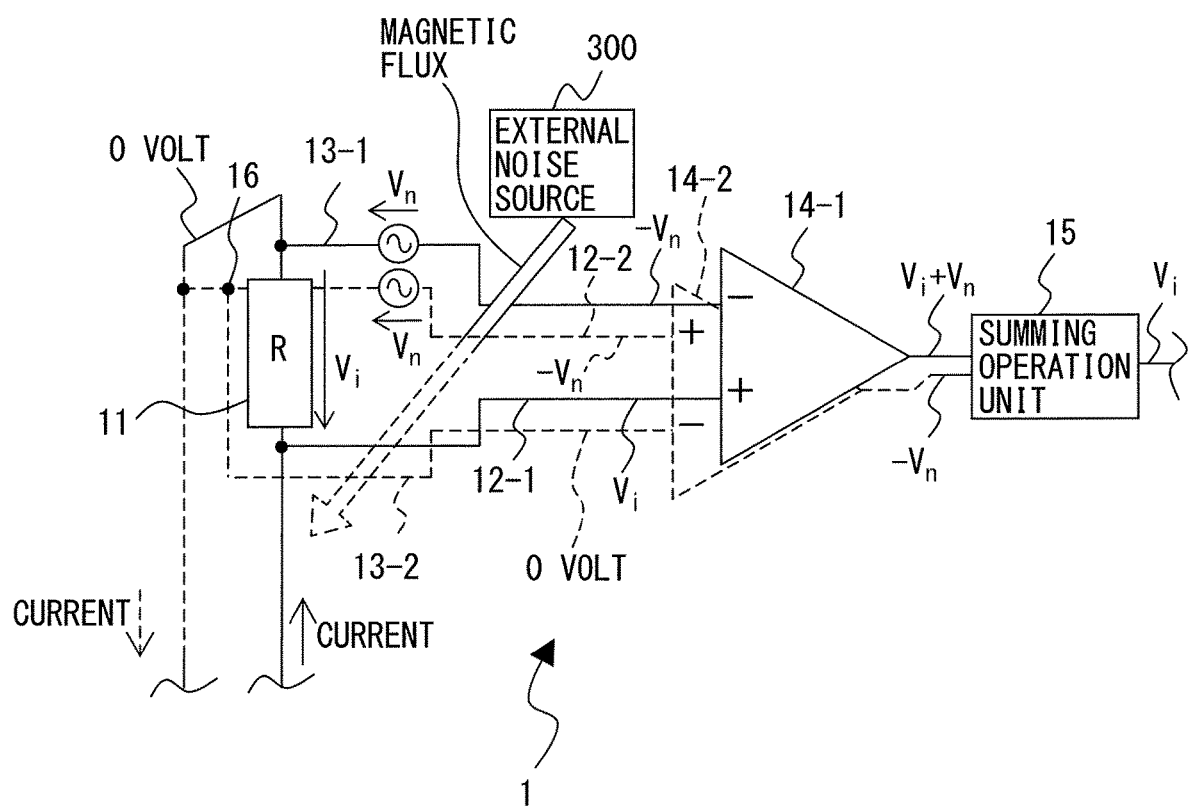
FIG. 3 is a diagram for illustrating the principle of operation of the current detection circuit according to an embodiment of the present disclosure.
Figure 4:
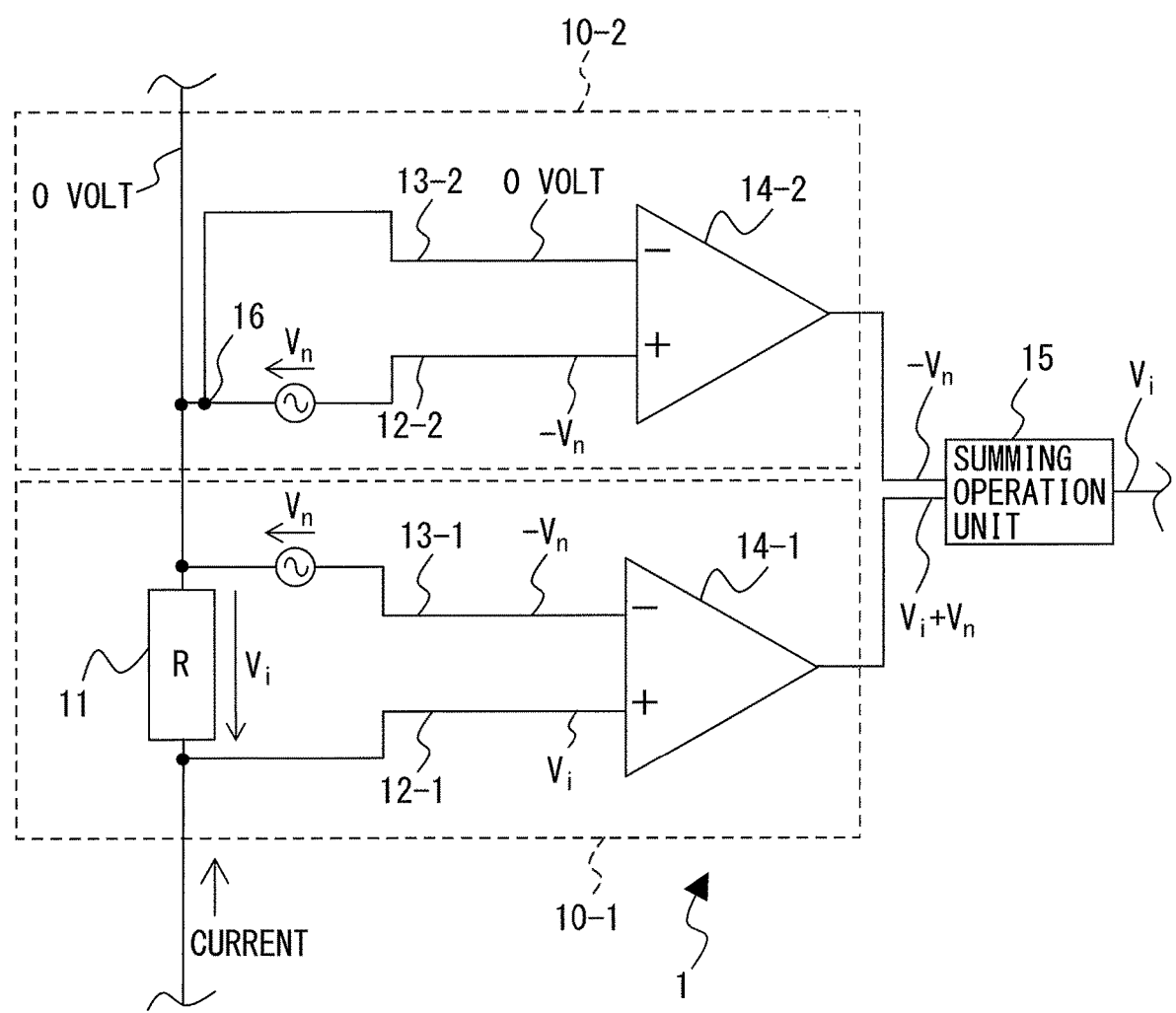
FIG. 4 is a circuit diagram of the current detection circuit illustrated in FIG. 3.

With reference to FIGS. 3 and 4, description will be made as to the accuracy of the current detection by the current detection circuit according to an embodiment of the present disclosure illustrated in FIGS. 1 and 2. FIG. 3 is a diagram for illustrating the principle of operation of the current detection circuit according to an embodiment of the present disclosure. FIG. 4 is a circuit diagram of the current detection circuit illustrated in FIG. 3. In FIG. 3, voltage values and current values of the components illustrated in FIG. 1 are indicated. Similarly to FIG. 1, the components disposed on the front surface of the printed circuit board are denoted by solid lines while the components disposed on the back surface of the printed circuit board are denoted by broken lines, and the printed circuit board is not illustrated in the drawing for the sake of simplicity. In FIG. 4, voltage values and current values of the components illustrated in FIG. 2 are indicated.

Let the resistance value of the resistor 11 be R. It is assumed here a voltage value $V_i$ appears across the resistor 11 because of a current flowing through the resistor 11 in the direction indicated by an arrow in the drawing (from the first terminal to the second terminal). To simplify descriptions herein, the potential at the second terminal side, i.e., the side where the current flows out of the resistor 11 is understood to be a reference potential (0 volt).

In the example illustrated in FIG. 3, the magnetic flux originating in the external noise generated by the external noise source 300 and passing through the region enclosed by the closed loop formed by conductors is denoted by a hollow arrow, and the solid line of the arrow denotes the part of the magnetic flux on the front side of the printed circuit board while the broken line of the arrow denotes the part of the magnetic flux on the back side of the printed circuit board. As described above, in the present embodiment, the area enclosed by the closed loop in the first differential signal transmission circuit 10-1 formed by the resistor 11, the first signal transmission unit 12-1, the first difference operation unit 14-1, and the second signal transmission unit 13-1 is substantially equal to the area enclosed by the closed loop in the second differential signal transmission circuit 10-2 formed by the noise-capturing transmission unit starting point 16, the third signal transmission unit 12-2, the second difference operation unit 14-2, and the fourth signal transmission unit 13-2. Besides, since the first differential signal transmission circuit 10-1 and the second differential signal transmission circuit 10-2 are disposed close to each other with the printed circuit board therebetween, the change of the magnetic flux through the region enclosed by the closed loop in the first differential signal transmission circuit 10-1 is substantially identical to the change of the magnetic flux through the region enclosed by the closed loop in the second differential signal transmission circuit 10-2. Therefore, substantially identical electromotive forces due to electromagnetic induction are produced in the first differential signal transmission circuit 10-1 and the second differential signal transmission circuit 10-2. Let these electromotive forces be $V_n$. The third signal transmission unit 12-2 is connected with the positive input terminal (+) of the second difference operation unit 14-2 and the fourth signal transmission unit 13-2 is connected with the negative input terminal (−) of the second difference operation unit 14-2 so that the differential signal transmitted by the second differential signal transmission circuit 10-2 including the third signal transmission unit 12-2 and the fourth signal transmission unit 13-2 and inputted to the second difference operation unit 14-2 has a polarity reverse to that of the differential signal transmitted by the first differential signal transmission circuit 10-1 including the first signal transmission unit 12-1 and the second signal transmission unit 13-1 and inputted to the first difference operation unit 14-1. Hence, with regard to the electromotive force due to electromagnetic induction, produced by the changes in the magnetic flux through the closed loops, the first signal transmission unit 12-1 and the fourth signal transmission unit 13-2 disposed close to each other have the same potential, and the second signal transmission unit 13-1 and the third signal transmission unit 12-2 disposed close to each other have the same potential. For the sake of simplified description, the electromotive forces $V_n$ due to electromagnetic induction, produced by the changes in the magnetic flux through the regions enclosed by the closed loops, are treated as voltage sources producing an equal voltage, located in the second signal transmission unit 13-1 and the third signal transmission unit 12-2.

In the first differential signal transmission circuit 10-1, the first signal transmission unit 12-1 transmits a signal indicating the potential $V_i$ at the first terminal side of the resistor 11 to the positive input terminal (+) of the first difference operation unit 14-1. In the second signal transmission unit 13-1, since there is a voltage source for the electromotive force $V_n$ due to electromagnetic induction, produced by the changes in the magnetic flux through the region enclosed by the closed loop, a signal indicating $-V_n$ is inputted to the negative input terminal (−) of the first difference operation unit 14-1. As a result, the first difference operation unit 14-1 executes a difference operation on the signal transmitted by the first signal transmission unit 12-1 and the signal transmitted by the second signal transmission unit 13-1 to output a first difference signal, which indicates a voltage $V_i+V_n$.

In the second differential signal transmission circuit 10-2, the potential at the noise-capturing transmission unit starting point 16 is equal to the potential at the second terminal side of the resistor 11 in the present embodiment. Thus the fourth signal transmission unit 13-2 transmits a signal indicating 0 volt, which is the potential at the noise-capturing transmission unit starting point 16 and is at the same time the potential at the second terminal side of the resistor 11, to the negative input terminal (−) of the second difference operation unit 14-2. In the third signal transmission unit 12-2, since there is a voltage source for the electromotive force $V_n$ due to electromagnetic induction, produced by the change in the magnetic flux through the region enclosed by the closed loop, a signal indicating $-V_n$ is inputted to the positive input terminal (+) of the second difference operation unit 14-2. As a result, the second difference operation unit 14-2 executes a difference operation on the signal transmitted by the third signal transmission unit 12-2 and the signal transmitted by the fourth signal transmission unit 13-2 to output a second difference signal, which indicates a voltage $-V_n$.

The summing operation unit 15 executes a summing operation on the first difference signal indicating the voltage $V_i+V_n$ outputted by the first difference operation unit 14-1 and the second difference signal indicating the voltage $-V_n$ outputted by the second difference operation unit 14-2 to obtain a summed signal, which indicates a voltage $V_i$. In other words, given the above-described arrangements of the first differential signal transmission circuit 10-1 and the second differential signal transmission circuit 10-2, the electromotive force $V_n$ due to electromagnetic induction produced by the change in the magnetic flux through the region enclosed by the closed loop in the first differential signal transmission circuit 10-1 and the electromotive force $V_n$ produced by the change in the magnetic flux through the region enclosed by the closed loop in the second differential signal transmission circuit 10-2 cancel each other, allowing the summing operation unit 15 to output a signal indicating the voltage $V_i$, which is the voltage across the resistor 11. The signal outputted by the summing operation unit 15 corresponds to the result of the current detection by the current detection circuit 1. As has been described, the current detection circuit 1 according to the present embodiment can detect a current with high accuracy without being affected by the external noise generated by the external noise source 300. Regardless of whether the external noise is caused by a change in the current through a conductor separate from the current detection circuit 1 or by a change in the voltage applied to the conductor, electromotive force due to electromagnetic induction are produced likewise in the signal transmission units. Thus, the current detection circuit 1 according to the present embodiment can perform current detection with high accuracy when exposed with external noise regardless of whether the noise is caused by a change in current or in voltage.

Figure 5:
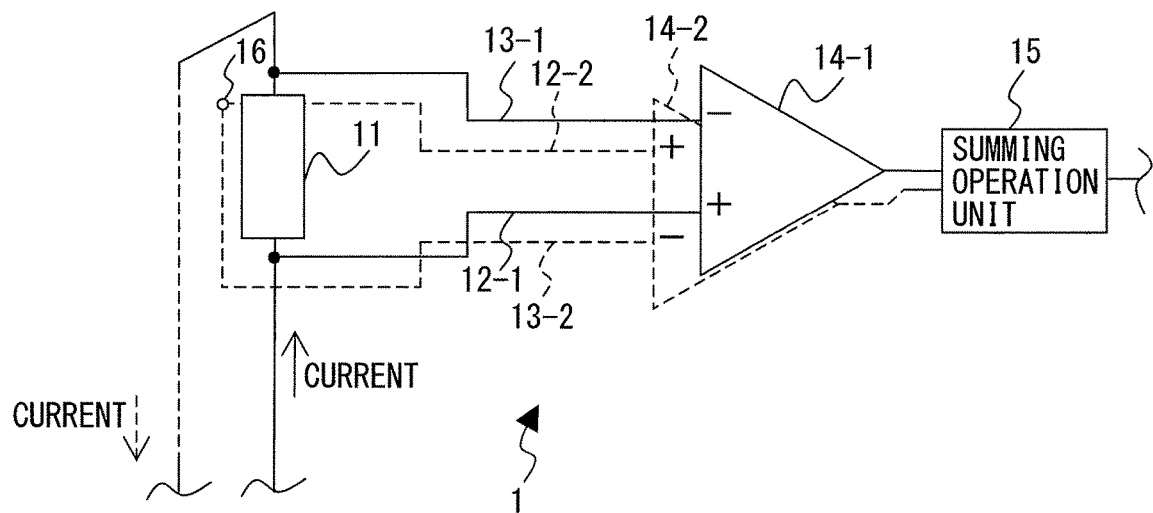
FIG. 5 is a diagram schematically illustrating a modified example of the current detection circuit according to an embodiment of the present disclosure.
Figure 6:
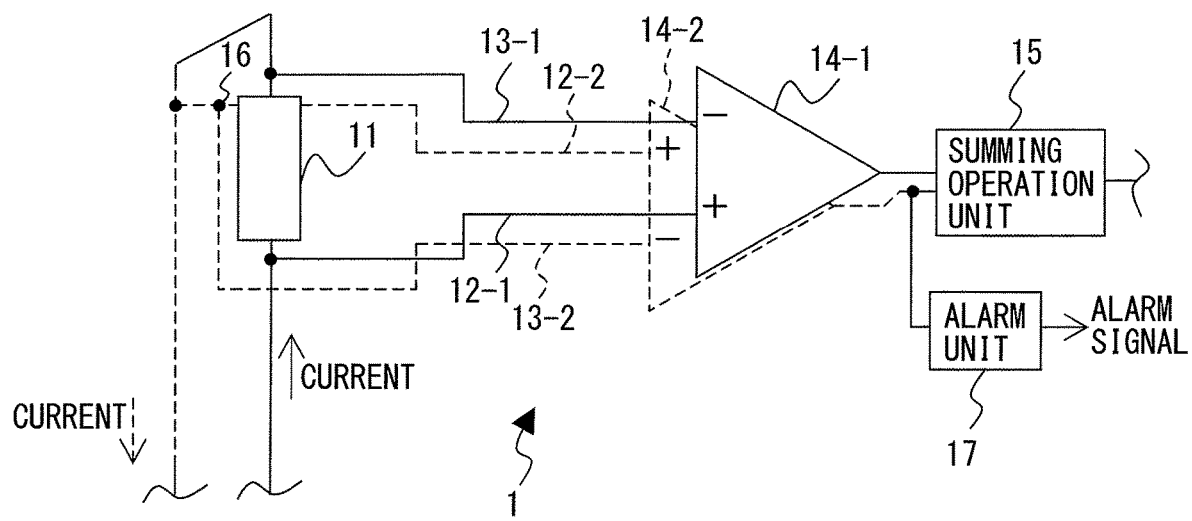
FIG. 6 is a diagram schematically illustrating another modified example of the current detection circuit according to an embodiment of the present disclosure.
Figure 7:
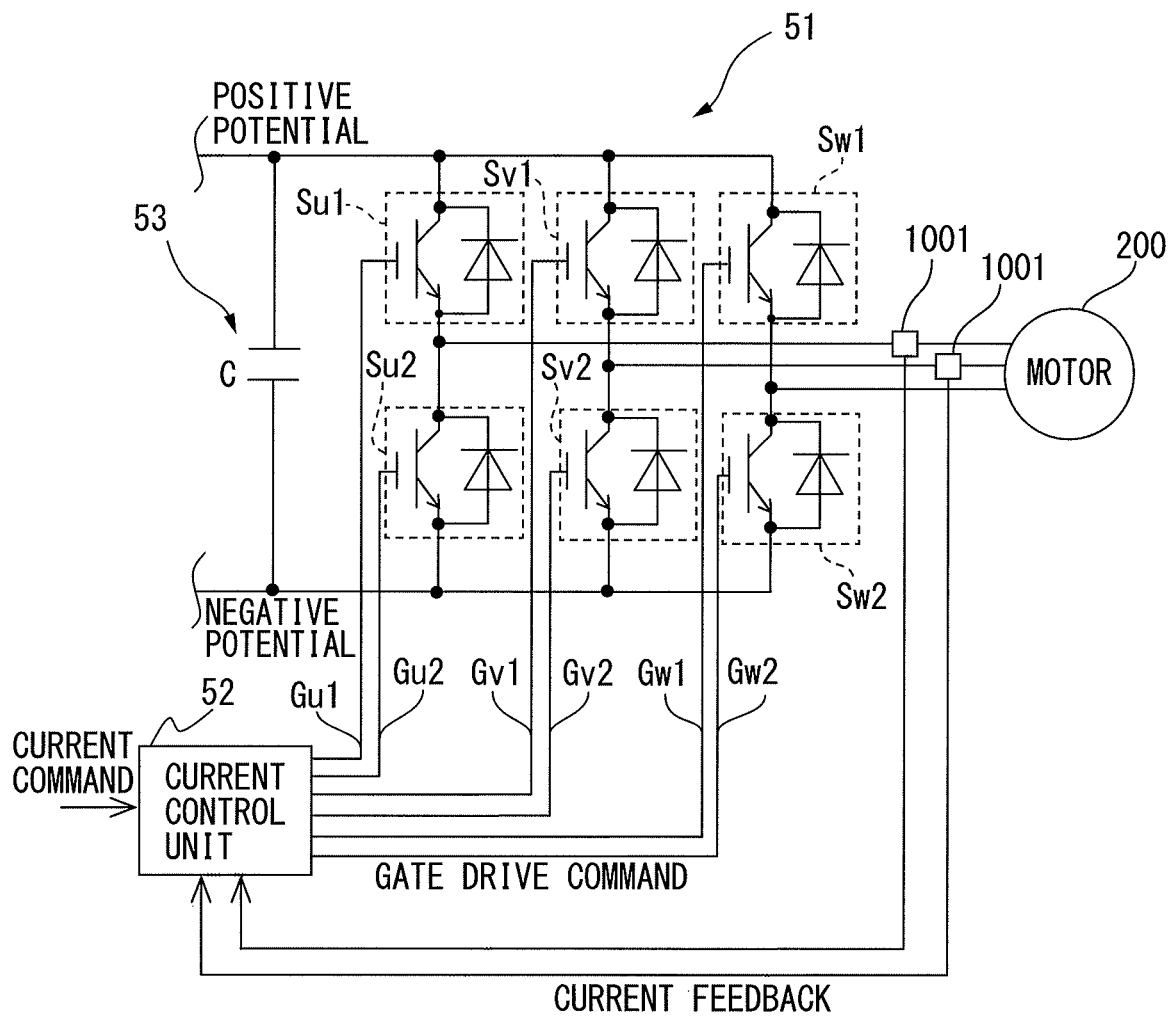
FIG. 7 is a circuit diagram of a common motor driving device.
Figure 8:
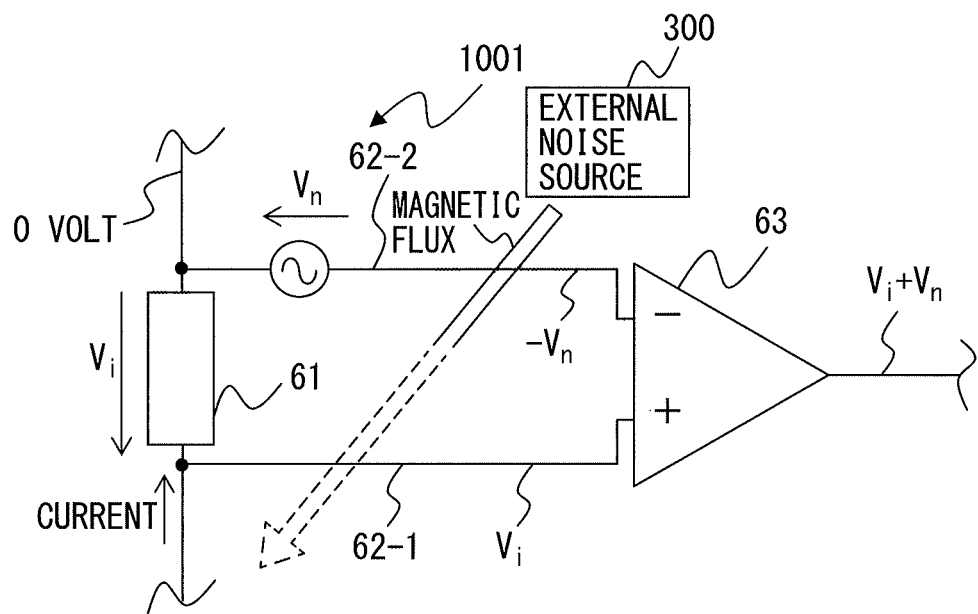
FIG. 8 is a circuit diagram for illustrating a deterioration of accuracy in the current detection by a conventional current detection circuit employing a shunt resistor method due to the effects of external noise.
Figure 9:
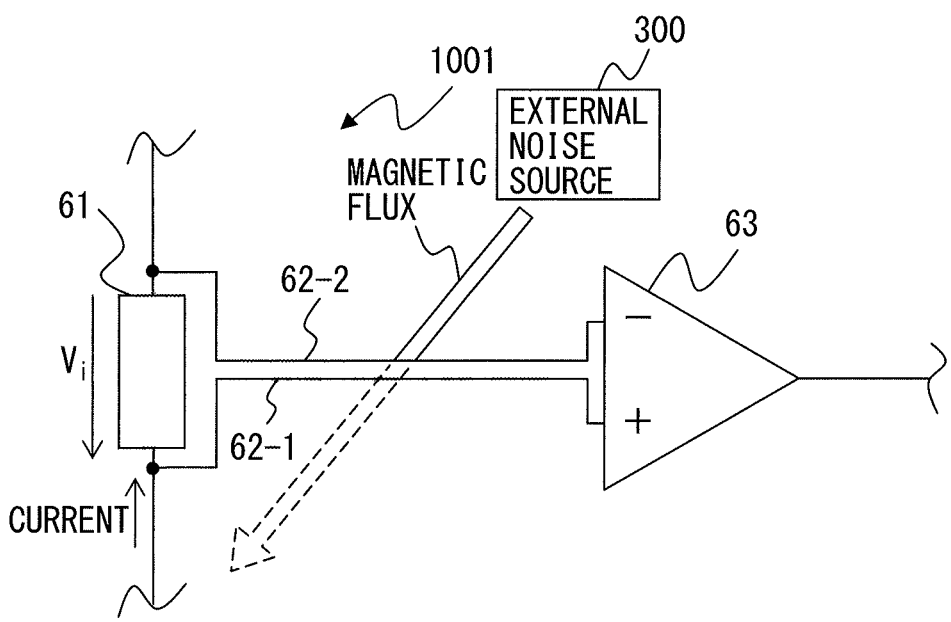
FIG. 9 is a circuit diagram for illustrating a common technique of reducing the effects of external noise in a conventional current detection circuit employing a shunt resistor method.

With reference to FIGS. 5 and 6, a modified examples of the current detection circuit according to an embodiment of the present disclosure will be described.

FIG. 5 is a diagram schematically illustrating a modified example of the current detection circuit according to an embodiment of the present disclosure.

The noise-capturing transmission unit starting point 16 may be disposed in any position in the motor driving device as long as it satisfies the condition that the magnetic flux through the region enclosed by the closed loop formed by the resistor 11, the first signal transmission unit 12-1, the first difference operation unit 14-1, and the second signal transmission unit 13-1 is substantially identical to the magnetic flux through the region enclosed by the closed loop formed by the noise-capturing transmission unit starting point 16, the third signal transmission unit 12-2, the second difference operation unit 14-2, and the fourth signal transmission unit 13-2. For example, the noise-capturing transmission unit starting point 16 may be disposed not on a branch line of the current path connected with the resistor 11 as illustrated in FIGS. 1 to 4 but in a position electrically independent of the current path connected with the resistor 11 as illustrated in FIG. 5. The other components constituting the circuits are similar to those illustrated in FIGS. 1 to 4 and will not be described any further. Like components constituting the circuits are denoted by like reference numerals.

FIG. 6 is a diagram schematically illustrating another modified example of the current detection circuit according to an embodiment of the present disclosure. The second difference operation unit 14-2 in the second differential signal transmission circuit 10-2 formed by the noise-capturing transmission unit starting point 16, the third signal transmission unit 12-2, the second difference operation unit 14-2, and the fourth signal transmission unit 13-2 outputs a second difference signal. The second difference signal indicates the electromotive force $-V_n$, which is produced by a change in the magnetic flux through the closed loop in the second differential signal transmission circuit 10-2 due to the effects of external noise. The effects of the external noise on the current detection circuit 1, therefore, can be detected by monitoring the output results of the second difference operation unit 14-2. In the modified example illustrated in FIG. 6, the current detection circuit 1 further includes an alarm unit 17 that outputs an alarm signal when the difference signal outputted by the second difference operation unit 14-2 exceeds a certain threshold value. This alarm signal indicates that the motor driving device provided with the current detection circuit 1 is in an intense noise environment. The alarm signal outputted by the alarm unit 17 may be used to cause a display device, which may be of various kinds, to indicate an alarm or to cause an audio device, which may be of various kinds, to emit an alarm sound or a buzzing sound. Further, an alarm signal may be stored in recording media such as CD-R or DVD-R or in a network storage to enable a display device, which may be of various kinds, to indicate an alarm or to enable an audio device, which may be of various kinds, to emit an alarm sound or a buzzing sound, at a time selected by the operator. With the alarm unit 17, the operator can easily recognize that the motor driving device provided with the current detection circuit 1 is in an intense noise environment. The other components constituting the circuits are similar to those illustrated in FIGS. 1 to 5 and will not be described any further. Like components constituting the circuits are denoted by like reference numerals. The modified example illustrated in FIG. 6 is also applicable to the modified example illustrated in FIG. 5.

By using the above-described current detection circuit 1 for detecting a motor current in a motor driving device, feedback control can be performed based on a current detected with high accuracy without being affected by external noise, which enables a motor control with high accuracy. Note that the current detection circuit 1 may be used not only for detecting a motor current but also for detecting a current in a converter (rectifier) rectifying an AC power supply to generate a DC power supply. The current detection circuit 1 may also be used for detecting a current in a motor driving device driving a DC motor. Although the above-described examples relate to a case with electromagnetic induction resulting from a change in the current in a current path exposed to external noise, similar advantageous effects are observed with respect to a case with electrostatic induction resulting from a change in the voltage.

According to an aspect of the present disclosure, there is provided a current detection circuit that employs a shunt resistor method and detects current flowing in a current path in a motor driving device with high accuracy without being affected by external noise.

By using the current detection circuit according to an aspect of the present disclosure for detecting a motor current in a motor driving device, feedback control can be performed using a current detected with high accuracy without being affected by external noise, which enables motor control with high accuracy. The current detection circuit according to an aspect of the present disclosure may be used not only for detecting a current in a motor but also for detecting a current in a converter (rectifier) rectifying an AC power supply to generate a DC power supply. The current detection circuit according to an aspect of the present disclosure may be used for detecting a current in a motor driving device driving a DC motor or for detecting a current in other electric appliances than a motor driving device. In any of the cases, the current detection circuit according to an aspect of the present disclosure detects a current with high accuracy without being affected by external noise, which improves accuracy in control and detection operations for the appliances.

Generally speaking, a current detection circuit employing a shunt resistor includes as its components a shunt resistor and a difference operation circuit. A conventional technique for improving accuracy involves, for example, a use of two sets of current detection circuits, each including a combination of a shunt resistor and a difference operation circuit to calculate the average of the values detected by the current detection circuits for the purpose of noise reduction. In contrast, according to an aspect of the present disclosure, the current detection circuit is constituted by a single shunt resistor and two difference operation circuits and can therefore be mounted in a smaller area by freeing the area that would be set aside for another shunt resistor in a conventional technique. In addition, with the difference operation circuits disposed on both surfaces of the printed circuit board, the current detection circuit can be mounted substantially in an area just enough for a single set of the current detection circuit including a combination of a single shunt resistor and a difference operation circuit, which leads to a further reduction of the area used for mounting the circuit.

What is claimed is:

1. A current detection circuit that detects a current flowing in a current path in a motor driving device, the circuit comprising:
   a resistor disposed in the current path;
   a first signal transmission wire that transmits a signal indicating a potential at a first terminal side of the resistor;
   a second signal transmission wire that transmits a signal indicating a potential at a second terminal side of the resistor;
   a first difference operation circuit that obtains a first difference signal by executing a difference operation in which the signal transmitted by the second signal transmission wire is subtracted from the signal transmitted by the first signal transmission wire;
   a noise-capturing transmission starting point provided in the motor driving device;
   a third signal transmission wire connected with the noise-capturing transmission starting point;
   a fourth signal transmission wire connected with the noise-capturing transmission starting point and being a different wire from the third signal transmission wire;
   a second difference operation circuit that obtains a second difference signal by executing a difference operation in which the signal transmitted by the fourth signal transmission wire is subtracted from the signal transmitted by the third signal transmission wire; and
   a summing operation circuit that obtains a summed signal by executing a summing operation on the first difference signal and the second difference signal,
   wherein the first signal transmission wire and the fourth signal transmission wire are disposed close to each other and the second signal transmission wire and the third signal transmission wire are disposed close to each other, and
   wherein the noise-capturing transmission starting point is disposed in such a position that magnetic flux through a region enclosed by a closed loop formed by the resistor, the first signal transmission wire, the first difference operation circuit, and the second signal transmission wire is substantially identical to magnetic flux through a region enclosed by a closed loop formed by the noise-capturing transmission starting point, the third signal transmission wire, the second difference operation circuit, and the fourth signal transmission wire.

2. The current detection circuit according to claim 1, wherein the noise-capturing transmission starting point is disposed either on a current path on the second terminal side of the resistor or on a branch line of a current path on the second terminal side of the resistor.

3. The current detection circuit according to claim 2, wherein, on opposite surfaces of a printed circuit board, the first signal transmission wire and the fourth signal transmission wire are disposed in plane symmetry, the second signal transmission wire and the third signal transmission wire are disposed in plane symmetry, the first difference operation circuit and the second difference operation circuit are disposed in plane symmetry, with respect to the printed circuit board.

4. The current detection circuit according to claim 1, wherein the first difference signal and the second difference signal are digital data, and wherein the summing operation circuit executes a summing operation by digital arithmetic processing.

5. The current detection circuit according to claim 1, further comprising an alarm that outputs an alarm signal when the second difference signal exceeds a certain threshold value.

* * * * *

UNITED STATES PATENT AND TRADEMARK OFFICE
CERTIFICATE OF CORRECTION

PATENT NO. : 10,585,122 B2  
APPLICATION NO. : 15/692325  
DATED : March 10, 2020  
INVENTOR(S) : Kunio Tsuchida, Taku Sasaki and Kiichi Inaba Page 1 of 1

It is certified that error appears in the above-identified patent and that said Letters Patent is hereby corrected as shown below:

In the Claims

Column 14, Claim 3, delete "claim 2" and insert -- claim 1 --

Signed and Sealed this  
First Day of December, 2020

Andrei Iancu  
*Director of the United States Patent and Trademark Office*